(12) United States Patent
Nara

(10) Patent No.: US 7,428,464 B2
(45) Date of Patent: Sep. 23, 2008

(54) WIDEBAND SIGNAL ANALYZER

(75) Inventor: Akira Nara, Kodaira (JP)

(73) Assignee: Tektronix, Inc., Beaverton, OR (US)

( * ) Notice: Subject to any disclaimer, the term of this patent is extended or adjusted under 35 U.S.C. 154(b) by 781 days.

(21) Appl. No.: 10/855,040

(22) Filed: May 26, 2004

(65) Prior Publication Data

US 2005/0021261 A1 Jan. 27, 2005

(30) Foreign Application Priority Data

Jul. 2, 2003 (JP) ............................. 2003-270247

(51) Int. Cl.
*G06F 19/00* (2006.01)
(52) U.S. Cl. .......................... 702/75; 702/72
(58) Field of Classification Search .................. 702/75, 702/57, 69, 72, 79
See application file for complete search history.

(56) References Cited

U.S. PATENT DOCUMENTS

| | | | |
|---|---|---|---|
| 5,659,546 A | | 8/1997 | Elder |
| 6,154,443 A * | | 11/2000 | Huang et al. ................. 370/210 |
| 6,324,559 B1 * | | 11/2001 | Hellberg ...................... 708/321 |
| 6,340,883 B1 | | 1/2002 | Nara |
| 6,356,067 B1 | | 3/2002 | Nara |
| 6,370,133 B1 * | | 4/2002 | Kang et al. .................. 370/342 |
| 6,380,879 B2 | | 4/2002 | Kober et al. |
| 6,618,434 B2 * | | 9/2003 | Heidari-Bateni et al. .... 375/148 |
| 6,980,147 B2 | | 12/2005 | Mathis et al. |
| 7,010,443 B2 * | | 3/2006 | Torin et al. .................... 702/69 |
| 2001/0000216 A1 * | | 4/2001 | Kober et al. ................. 341/155 |
| 2002/0080862 A1 * | | 6/2002 | Ali .............................. 375/148 |
| 2004/0128076 A1 | | 7/2004 | Pupalaikis et al. |

FOREIGN PATENT DOCUMENTS

| JP | 57091455 | 6/1982 |
|---|---|---|
| JP | 6034682 | 2/1994 |
| JP | 9166623 | 6/1997 |
| JP | 2000258477 | 9/2000 |
| JP | 2001228185 | 8/2001 |

OTHER PUBLICATIONS

ATIS Committee T1A1, "Nyquist rate", last generated Feb. 28, 2001; http://www.atis.org/tg2k/_nyquist_rate.html.*
Agilent Technologies, Inc. "89600 Vector Signal Analyzers" Data Sheet May 28, 2003.

* cited by examiner

*Primary Examiner*—Manuel L Barbee
(74) *Attorney, Agent, or Firm*—Francis I. Gray; Michael A. Nelson

(57) ABSTRACT

A wideband signal analyzer has a plurality of frequency conversion paths for simultaneously processing different contiguous frequency bands of an input signal. Each frequency conversion path provides time domain data for input to a digital signal processor. The digital signal processor interpolates each group of time domain data to produce interpolated time domain data having a number of data points that satisfies a Nyquist condition for a combined bandwidth of the frequency conversion paths. A calibration signal set to a border frequency between a pair of frequency conversion channels is used to calibrate the gains and phase differences between the frequency conversion paths so that the digital signal processor identifies corresponding time domain data between the interpolated time domain data groups. A suite of frequency domain data is calculated by the digital signal processor from the interpolated time domain data groups and stored for subsequent display.

14 Claims, 4 Drawing Sheets

US 7,428,464 B2

WIDEBAND SIGNAL ANALYZER

BACKGROUND OF THE INVENTION

The present invention relates to signal analysis, and more particularly to a wideband signal analyzer for analyzing next generation cellular phone signals.

A conventional frequency domain signal analyzer is shown in FIG. 1. A frequency converter 12 converts a signal under test down to an intermediate frequency (IF), and a bandpass filter 14 eliminates undesired frequencies outside the passband. A local oscillator 16 and a mixer 18 further convert the signal into a second IF that is converted by an analog-to-digital converter (ADC) 20 into digital time domain data. A digital signal processor (DSP) 22 produces frequency domain data from the time domain data by calculation, such as a fast Fourier Transform (FFT). The frequency domain digital data is stored in a memory 24 and may be displayed as a waveform on a display 26.

Due to the Nyquist limit, one-half the sampling frequency for the ADC 20 determines an upper limit of a frequency bandwidth for the signal analyzer. For wider bandwidths a higher sampling frequency is required. However a higher sampling frequency results in a decrease in the number of bits provided by the ADC 20 and an increase in the distortion characteristics of any IF amplifier prior to the ADC. The result is a decrease in dynamic range. Frequency domain analysis requires relatively high resolution, such as 12-14 bits, which requires a lower sampling frequency, so there is a conflict between the resolution (dynamic range) and bandwidth requirements.

U.S. Pat. No. 6,340,883 discloses one solution to the bandwidth versus dynamic range problem by separating the signal under test into I and Q signals using an analog demodulator at the input and then converting the I and Q signals separately into digital data so that it decreases the required sampling frequency of the ADCs for a given dynamic range and bandwidth by one-half. This makes it easier to deal with high speed and wideband signal processing. U.S. Pat. No. 6,356,067 further discloses a technology for effectively measuring a wideband signal by using wide and narrow band processing paths appropriately.

The dynamic range for current products, such as the Tektronix WCA380 Wireless Communication Analyzer which uses the I/Q split technique, is about 55 dB for a wide span of 30 MHz. The Agilent 89600 Vector Signal Analyzer alternatively uses a fast ADC to provide approximately the same dynamic range over the same wide span. These current products cannot provide the same dynamic range over the wider span necessary for the measurement of next generation cell phones. Although U.S. Pat. No. 6,340,883 makes the required sampling frequency one-half due to the I/Q split of the input signal, there is a limit to further widening of the bandwidth.

What is desired is to provide an architecture for wideband signal processing of next generation cell phones that provides a wider span independent of the ADC sampling frequency.

BRIEF SUMMARY OF THE INVENTION

Accordingly the present invention provides a wideband signal analyzer that has a plurality of frequency conversion paths for simultaneously processing different contiguous frequency bands of an input signal. Each frequency conversion path provides time domain data for input to a digital signal processor. The digital signal processor interpolates each group of time domain data to produce interpolated time domain data having a number of data points that satisfies a Nyquist condition for a combined bandwidth of the frequency conversion paths. A calibration signal set to a border frequency between a pair of frequency conversion channels is used to calibrate the gains and phase differences between the frequency conversion paths so that the digital signal processor identifies corresponding time domain data between the interpolated time domain data groups. A suite of frequency domain data is calculated by the digital signal processor from the interpolated time domain data groups and stored for subsequent display.

The objects, advantages and other novel features of the present invention are apparent from the following detailed description when read in conjunction with the appended claims and attached drawing.

DETAILED DESCRIPTION OF THE INVENTION

Figure 1:
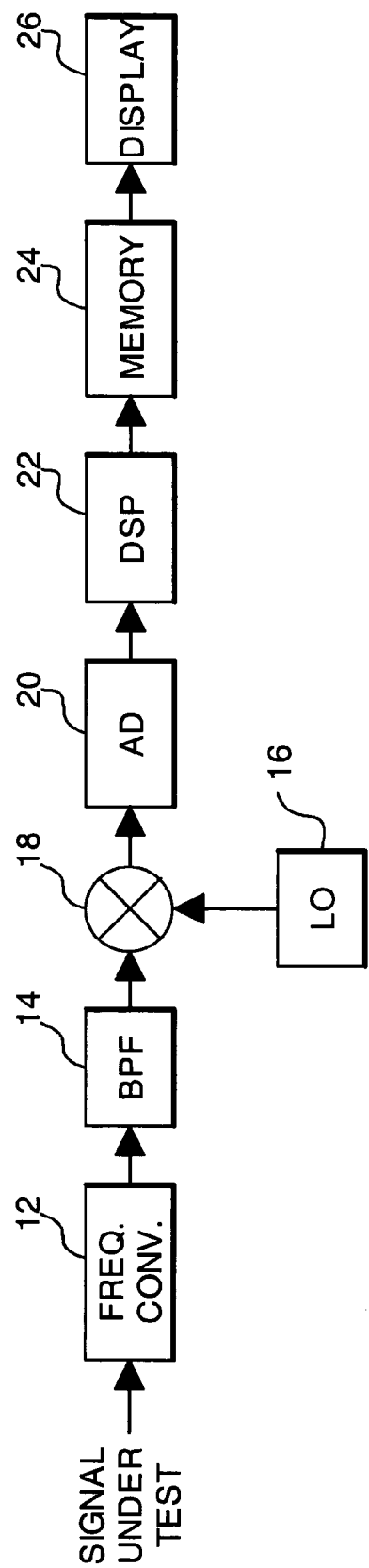
FIG. 1 is a block diagram view of a prior art signal analyzer.
Figure 2:
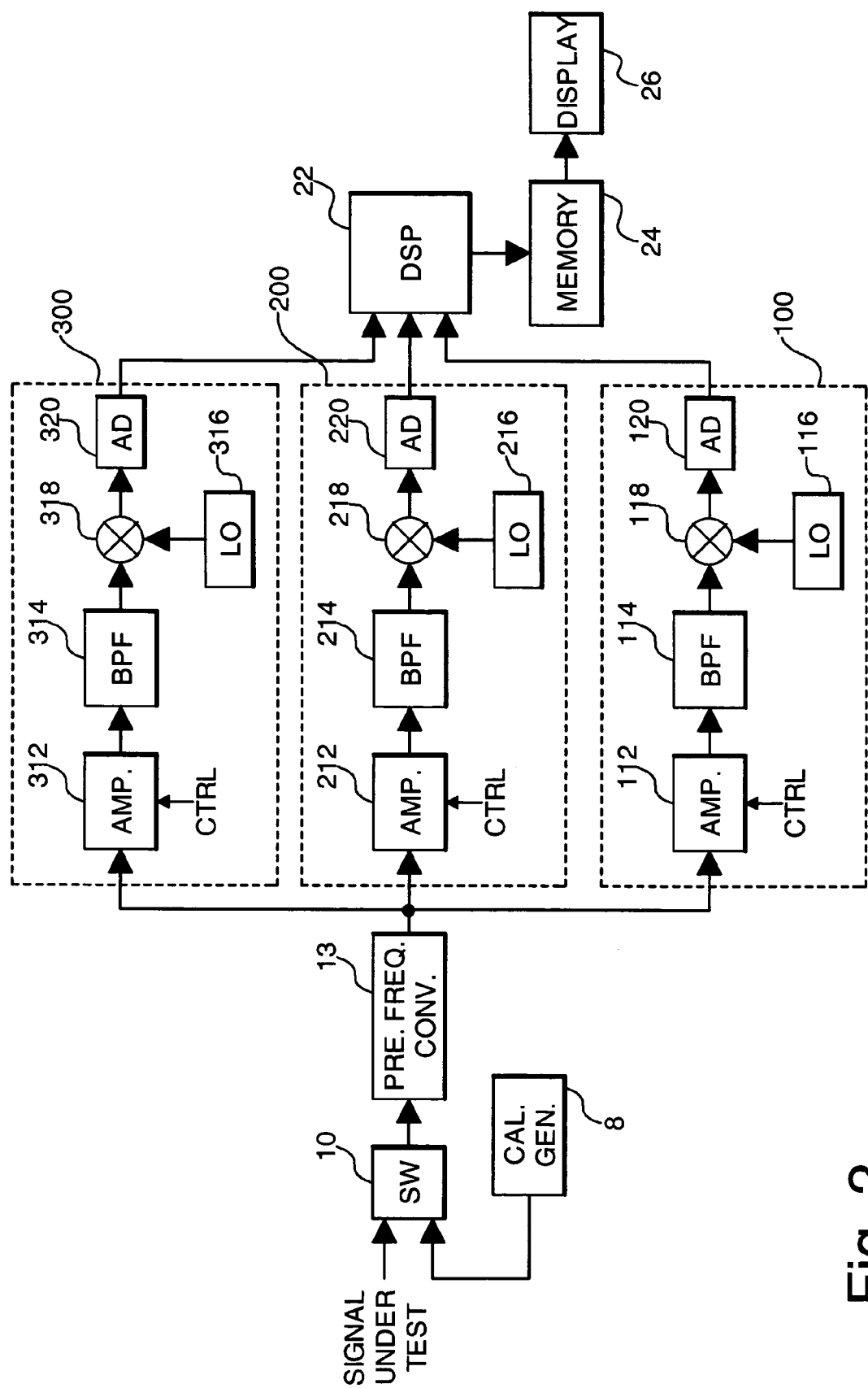
FIG. 2 is a block diagram view of a wideband signal analyzer according to the present invention.

Referring now to FIG. 2 a wideband signal analyzer is shown having a plurality of frequency conversion paths 100, 200, 300 to convert a signal under test in terms of different contiguous frequency bands to produce final IF signals just prior to digitization. ADCs 120, 220, 320 digitize the output of the frequency conversion paths, with the sampling frequencies of the ADCs limiting the bandwidths of the paths and the number of points from the digital data conversion. Therefore each group of time domain data from the frequency conversion paths 100, 200, 300 is interpolated by a digital signal processor (DSP) 22 to increase the number of data points in each group to satisfy a Nyquist condition necessary for a combined bandwidth of the frequency conversion paths. Time domain data of the necessary number of points are extracted from the interpolated time domain data groups by the DSP 22 to calculate a suite of frequency domain data.

In more detail a switch circuit 10 selectively provides a signal under test or a calibration signal from a calibration signal generator 8 to a preliminary frequency conversion stage 13. The preliminary frequency conversion stage 13 converts the input signal (signal under test or calibration signal) down to an intermediate frequency (IF) signal that is distributed to N frequency conversion paths 100, 200, 300—three in the illustrated example. Each bandpass filter (BPF) 114, 214, 314 in the frequency conversion paths has the same passband bandwidth Fb. However the center frequencies of the BPFs are shifted with respect to each other by Fb, i.e., if the second BPF 214 has a center frequency of Fc, then the center frequency of the first BPF 114 is set to Fc−Fb and the center frequency of the third BPF 314 is set to Fc+Fb.

The frequencies from local oscillators (LOs) 116, 216, 316 are also shifted from each other by Fb, i.e., by the same amount as the bandwidth of the BPFs. In other words if the frequency of the second LO 216 is Fo, the frequency of the first LO 116 is Fo−Fb and the frequency of the third LO 316 is Fo+Fb. It is preferable to arrange the center frequencies of the frequency conversion paths 100, 200, 300 and the frequencies of the LOs 116, 216, 316 as described above so that the final intermediate frequencies of the signals output from the frequency conversion paths are the same. The frequency bands of the three frequency conversion paths 100, 200, 300 are referred to hereafter as F1, F2 and F3.

Figure 3:
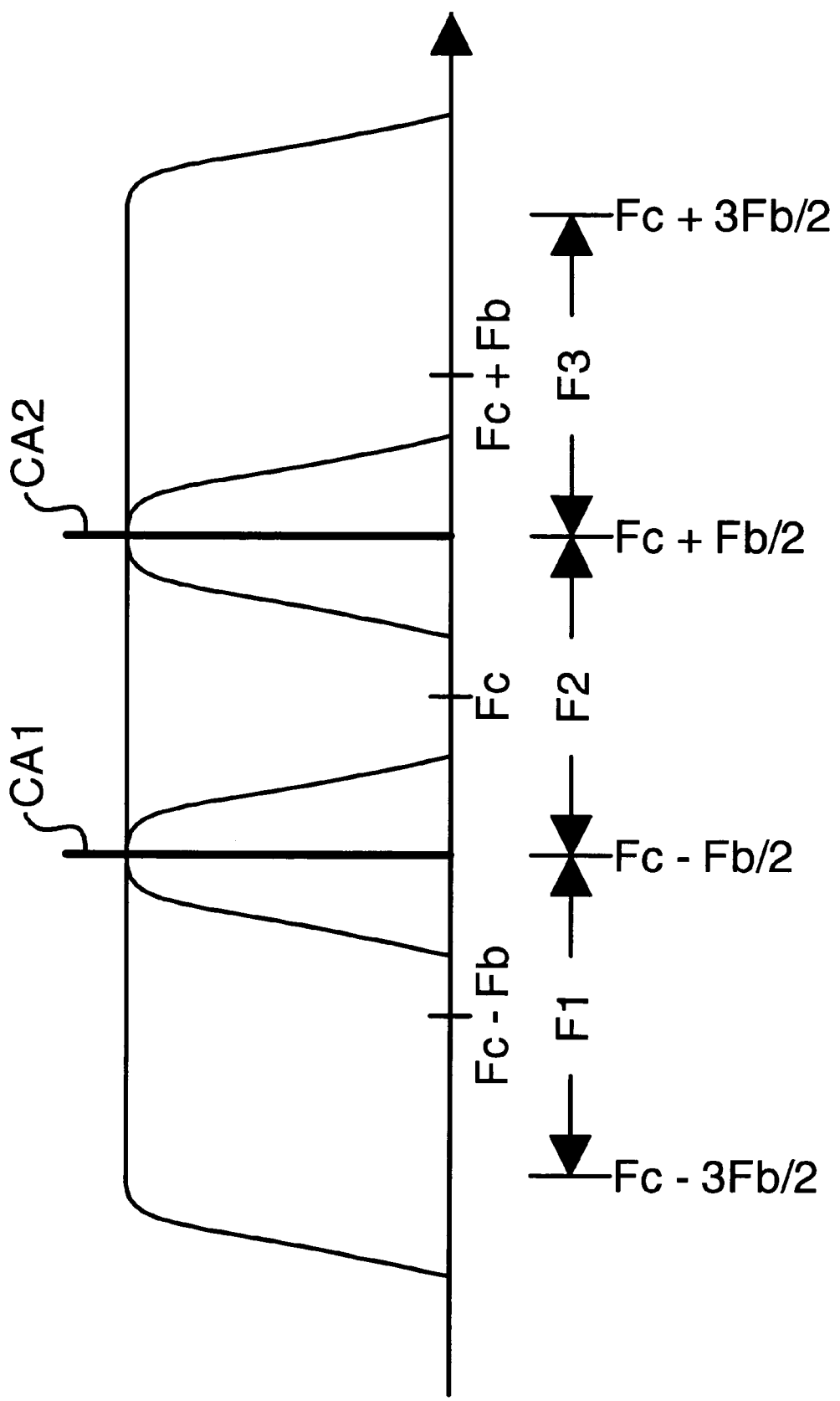
FIG. 3 is a graphic view illustrating the relationship between frequency bandwidths and signals for calibrating the wideband signal analyzer according to the present invention.

FIG. 3 illustrates the relationship between the frequency bands of the frequency conversion paths 100, 200, 300 and a pair of calibration signals CA1 and CA2. ADCs 120, 220, 320 respectively convert the corresponding final IF signals from mixers 118, 218, 318 into respective groups of time domain data that are provided to a DSP 22. The DSP 22 converts the time domain data groups into a suite of frequency domain data combined into a single span. Although not shown, each ADC 120, 220, 320 may perform an I/Q split as disclosed in U.S. Pat. No. 6,340,883 to divide the intermediate frequency in two and then separately digitize the I/Q components. In this example if the sampling frequencies of the ADCs 120, 220, 320 are the same (Fs), it is not necessary to make the bandwidths Fb smaller than Fs/2, and Fb may be set in the range of Fs/2<Fb<Fs—this allows Fb to have a wider bandwidth than normal.

To calculate the suite of frequency domain data from the time domain data groups requires a number of time domain data points corresponding to a number sampled at a frequency of two times the bandwidth 3Fb/2, i.e., 3Fb, which also allows Fb to have a wider bandwidth than normal or even higher by using the I/Q split technique. The bandwidth 3Fb/2 is from the center frequency of the second frequency conversion path 200 to the upper limit of the third frequency conversion path 300 or to the lower limit of the first frequency conversion path 100. If the IF signal is sampled by a sampling frequency Fs that satisfies the relationship of Fs/2<Fb<Fs, i.e., Fb<Fs<2Fb, then the number of data points is insufficient since Fs is less than 3Fb. Therefore the DSP 22 interpolates the data to increase the number of bits of the time domain data obtained directly from the ADCs 120, 220, 320 at least two to three times. Then the DSP 22 extracts necessary time domain data from the interpolated time domain data of the frequency bands F1, F2 and F3 and converts them into the suite of frequency domain data. In order for the DSP 22 to select corresponding time domain data from the respective groups such that there is no phase difference, which may be caused by differences in the frequency conversion paths 100, 200, 300, the frequency conversion paths are calibrated as described below. A memory 24 stores the suite of frequency domain data, which may then be displayed on a suitable display 26.

For a given desired bandwidth FB, N frequency conversion paths lead to a frequency bandwidth for each frequency conversion path of FB/N. Therefore the sampling frequency of the ADCs in each frequency path may be 1/N$^{th}$ of that required for a single frequency conversion path of bandwidth FB. With the frequency bandwidth at FB/N, it is easier to control frequency characteristics of the amplifiers 112, 212, 312 to reduce distortion. Also it allows the DSP 22 to use a slower clock and a wider signal band to provide the same performance. This improves the dynamic range significantly.

In an ideal model the plurality of frequency conversion paths 100, 200, 300 have no phase differences between each other. However each frequency conversion path performs analog processing that usually causes gain and phase differences due to age deterioration, temperature variations, etc. The following calibration method compensates for the phase differences. For calibration the switch circuit 10 provides a pair of calibration signals CA1, CA2 instead of the signal under test to the preliminary frequency conversion stage 13 when a user instructs or when a predetermined set time occurs to change it to calibration mode. The two calibration signals may be provided at different times.

Referring to FIG. 3 the frequency of the first calibration signal CA1 after conversion by the preliminary frequency conversion stage 13 is set to a border frequency of Fc−Fb/2, or the center between Fc−Fb and Fc of the first and second frequency bands F1, F2. Both the first and second frequency conversion paths 100, 200 output CA1 as an IF signal of Fb/2 that produces definite phase difference data. Similarly the frequency of the second calibration signal CA2 after conversion by the preliminary frequency conversion stage 13 is set to a border frequency Fc+Fb/2, or the center between the center frequencies Fc and Fc+Fb of the second and third frequency bands F2, F3. The first calibration signal CA1 is frequency converted and digitized in the first and second frequency conversion paths 100, 200, and provided to the DSP 22 as time domain digital data. The DSP 22 compares the phases and amplitudes of the two time domain data groups corresponding to the first calibration signal CA1. If the gains are significantly different, amplifiers 112, 212 are adjusted to produce the same gain. Similarly the calibration signal generator 8 provides the second calibration signal CA2 to the preliminary frequency conversion stage 13 via the switch circuit 10, and the gains of the second and third frequency conversion paths 200, 300 are adjusted.

Figure 4:
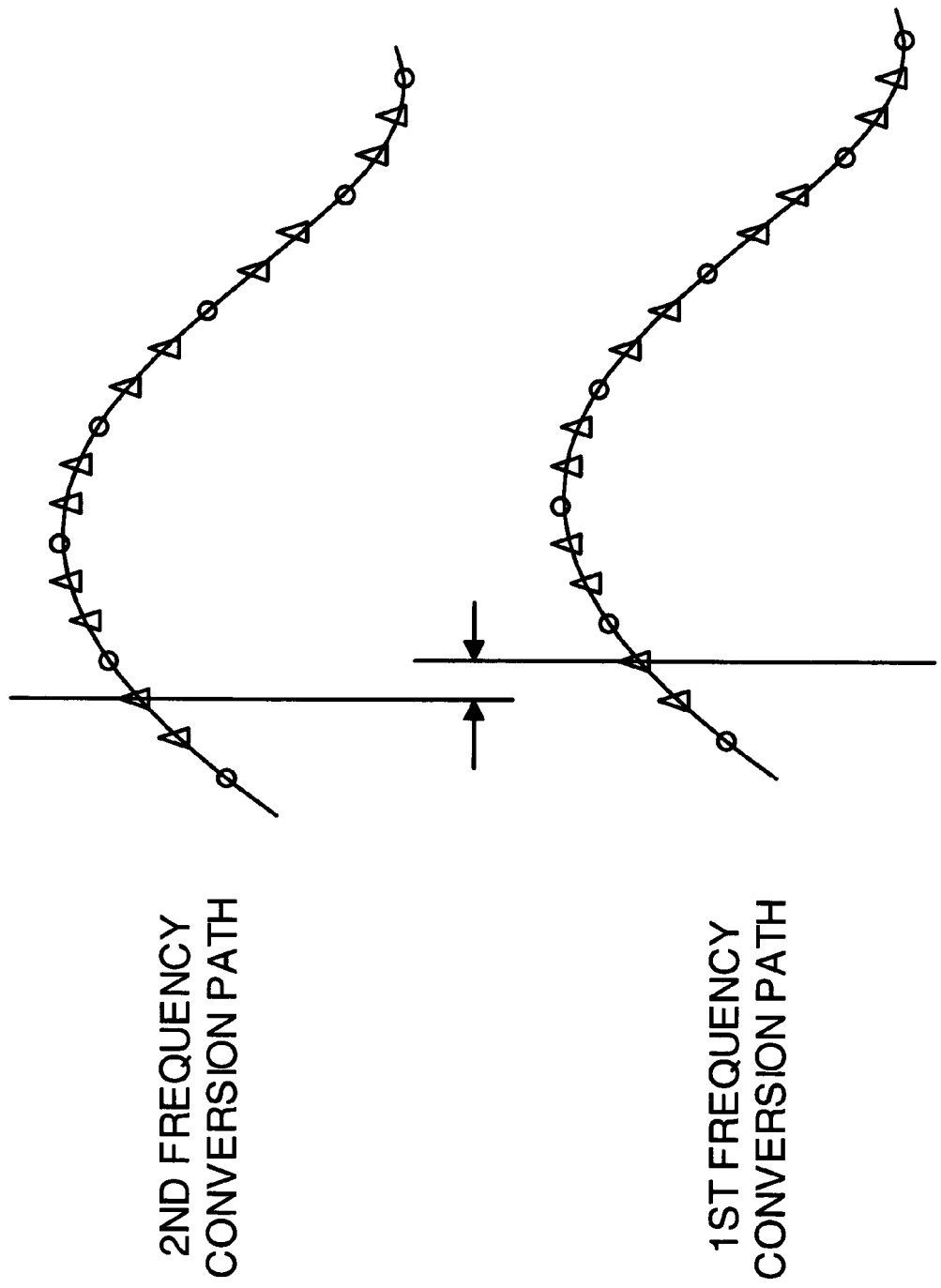
FIG. 4 is a graphic view illustrating a phase difference between interpolated time domain data of different frequency conversion paths in response to a calibration signal when processed by the wideband signal analyzer according to the present invention.

The DSP 22 may increase the data points of the time domain data obtained from the calibration signal by interpolation. In FIG. 4 circles indicate the time domain data obtained directly from the ADCs 120, 220, 320 and triangles indicate interpolated time domain data. The time domain data and the interpolated time domain data are collectively called "interpolated time domain data." The phase difference between the frequency conversion paths is precisely found by how many data points there are between corresponding data points of the respective interpolated time domain data groups. This phase difference information is used to identify a time for extracting corresponding time domain data from the interpolated time domain data groups of the different frequency conversion paths in order to calculate the frequency domain data. In the example shown there is one data point difference in phase between the first and second frequency conversion paths 100, 200 in terms of the interpolated time domain data groups.

One example of a measurement use for the wideband signal analyzer is the measurement of adjacent channel power. The preliminary frequency conversion stage 13 is initially adjusted so that the lower limit of the output IF signal band sets a border frequency Fc−Fb/2 between the first and second frequency conversion paths 100, 200 when it receives a signal under test, i.e., if there is no adjacent channel power the signal power is provided to only the second or upper frequency conversion paths 200, 300 and the first frequency conversion path 100 receives only noise. Then the gain of the first amplifier 112 is increased to effectively measure the noise and adjacent channel power, i.e., the second and upper frequency conversion paths measure the signal power and the first frequency conversion path measures the noise power and the adjacent channel power. The measurement performance is improved by the gain increase in the first frequency conversion path 100.

Similarly the preliminary frequency conversion stage 13 may be adjusted so that the upper limit of the output IF signal band is set to be a border frequency Fc+Fb/2 between the second and third frequency conversion paths 200, 300 so that the second and lower frequency conversion paths measure the signal power and the third frequency conversion path measures noise and adjacent channel power.

Thus the present invention provides a wideband signal analyzer by processing a signal under test using multiple frequency conversion paths that have different contiguous bandwidths to obtain respective groups of time domain data, interpolating the time domain data groups to produce interpolated time domain data groups that satisfy a Nyquist condition, and converting time domain data from the interpolated time domain data groups to a suite of frequency domain data for storage and display.

What is claimed is:

1. A wideband signal analyzer comprising:
 a plurality of frequency conversion paths having different contiguous frequency bands to which an input signal is provided for producing respective groups of time domain data;
 means for interpolating the time domain data in each group to increase the number of data points in each group, producing respective groups of interpolated time domain data; and
 means for calculating from the interpolated time domain data groups a suite of frequency domain data.

2. The wideband signal analyzer as recited in claim 1 wherein the number of data points in each interpolated time domain data group satisfies a Nyquist condition required for a combined bandwidth of the frequency conversion paths.

3. The wideband signal analyzer as recited in claim 1 further comprising a preliminary frequency conversion stage for producing from the input signal an intermediate frequency signal for input to the frequency conversion paths.

4. The wideband signal analyzer as recited in claim 1 further comprising means for providing a calibration signal to the frequency conversion paths to determine a phase difference between the frequency conversion paths in order to identify corresponding time domain data from the interpolated time domain data groups.

5. The wideband signal analyzer as recited in claim 4 wherein a frequency of the calibration signal comprises a border frequency between contiguous frequency bands of the frequency conversion paths.

6. The wideband signal analyzer as recited in claim 1 wherein an upper/lower limit of a channel of the input signal comprises a border frequency between contiguous frequency bands of the frequency conversion paths.

7. The wideband signal analyzer as recited in claim 6 further comprising means for independently setting a gain in each of the frequency conversion paths in order to measure signals in the respective frequency conversion paths.

8. A method of wideband signal analysis comprising the steps of:
 producing from a plurality of frequency conversion paths having different contiguous frequency bands to which an input signal is provided respective groups of time domain data;
 interpolating the time domain data in each group to increase the number of data points in each group, producing respective groups of interpolated time domain data; and
 calculating from the interpolated time domain data groups a suite of frequency domain data.

9. The method as recited in claim 8 wherein the number of data points in each interpolated time domain data group satisfies a Nyquist condition for a combined bandwidth of the frequency conversion paths.

10. The method as recited in claim 8 further comprising the step of producing an intermediate frequency signal from the input signal for input to the frequency conversion paths.

11. The method as recited in claim 8 further comprising the step of providing a calibration signal to the frequency conversion paths to determine a phase difference between the frequency conversion paths in order to identify corresponding time domain data from the interpolated time domain data groups.

12. The method as recited in claim 11 wherein the calibration signal comprises a border frequency between contiguous frequency bands of the frequency conversion paths.

13. The method as recited in claim 8 wherein an upper/lower limit of a channel of the input signal comprises a border frequency between contiguous frequency bands of the frequency conversion paths.

14. The method as recited in claim 13 further comprising the step of independently setting a gain in each of the frequency conversion paths in order to measure signals in the respective frequency conversion paths.

* * * * *